United States Patent [19]
Osann, Jr.

[11] Patent Number: 6,150,807
[45] Date of Patent: *Nov. 21, 2000

[54] INTEGRATED CIRCUIT ARCHITECTURE HAVING AN ARRAY OF TEST CELLS PROVIDING FULL CONTROLLABILITY FOR AUTOMATIC CIRCUIT VERIFICATION

[75] Inventor: Robert Osann, Jr., Los Altos, Calif.

[73] Assignee: LightSpeed Semiconductor Corp., Sunnyvale, Calif.

[*] Notice: This patent is subject to a terminal disclaimer.

[21] Appl. No.: 09/249,960

[22] Filed: Feb. 12, 1999

Related U.S. Application Data

[63] Continuation of application No. 08/707,912, Sep. 10, 1996, Pat. No. 5,872,448, which is a continuation of application No. 08/575,056, Dec. 21, 1995, abandoned, which is a continuation of application No. 08/436,495, May 8, 1995, abandoned, which is a continuation of application No. 07/924,506, Aug. 4, 1992, abandoned, which is a continuation-in-part of application No. 07/717,337, Jun. 18, 1991, abandoned.

[51] Int. Cl.$^7$ ....................................................... G01R 31/28
[52] U.S. Cl. ........................................ 324/158.1; 324/73.1
[58] Field of Search ................................ 324/158.1, 73.1, 324/765, 763; 714/733, 724; 702/84

[56] References Cited

U.S. PATENT DOCUMENTS

| | | | |
|---|---|---|---|
| 4,441,075 | 4/1984 | McMahon | 371/22.3 |
| 4,488,259 | 12/1984 | Macy | 371/22.3 |
| 4,556,840 | 12/1985 | Russell | 324/73 |
| 4,682,329 | 7/1987 | Kluth et al. | 371/22.3 |
| 4,701,921 | 10/1987 | Powell et al. | 371/25 |
| 4,739,250 | 4/1988 | Tanizawa | 371/22.3 |
| 4,749,947 | 6/1988 | Gheewala | 371/22.6 |
| 4,752,729 | 6/1988 | Jackson | 371/22.1 |
| 4,780,874 | 10/1988 | Lenoski et al. | 371/22.3 |
| 4,926,425 | 5/1990 | Hedtke et al. | 371/22.6 |
| 4,931,722 | 6/1990 | Stoica | 324/158 R |
| 5,043,986 | 8/1991 | Agrawal et al. | 371/25.1 |
| 5,054,024 | 10/1991 | Whetsel | 371/22.3 |
| 5,068,605 | 11/1991 | Yasunaga et al. | 324/158 R |
| 5,109,353 | 4/1992 | Sample et al. | 714/725 |
| 5,384,533 | 1/1995 | Tokuda et al. | 371/22.1 |
| 5,495,422 | 2/1996 | Olson | 365/230.04 |
| 5,528,600 | 6/1996 | El Ayat et al. | 371/22.1 |
| 5,534,774 | 7/1996 | Moore et al. | 324/158.1 |
| 5,614,818 | 3/1997 | El Ayat et al. | 324/158 |
| 5,809,039 | 9/1998 | Takahashi | 371/22.3 |

FOREIGN PATENT DOCUMENTS 6-109816  4/1994  Japan.

*Primary Examiner*—Vinh P. Nguyen
*Attorney, Agent, or Firm*—Fliesler Dubb Meyer & Lovejoy LLP

[57] ABSTRACT

A new circuit architecture is provided for testing digital integrated circuits which allows one to arbitrarily force any combination of logic values to be simultaneously driven onto any combination of internal nets. This allows all of the connections to each internal logic cell, and the logic cell itself, to be verified by applying a set of test patterns to each logic cell individually. In this way, the integrity of the entire device can be verified without having knowledge of the operation of the circuit as a whole.

3 Claims, 3 Drawing Sheets

| STR1 | STR0 | Output Operation |
|---|---|---|
| 0 | 0 | Normal |
| 0 | 1 | Latch Closed |
| 1 | 1 | Latch Open |

Interpretation of test Strobes STR1 and STR0

INTEGRATED CIRCUIT ARCHITECTURE HAVING AN ARRAY OF TEST CELLS PROVIDING FULL CONTROLLABILITY FOR AUTOMATIC CIRCUIT VERIFICATION

CROSS-REFERENCE TO RELATED DOCUMENTS

This application is a Continuation of Ser. No. 08/707,912, filed on Sep. 10, 1996, now U.S. Pat. No. 5,872,448, which is a continuation of 08/575,056, filed on Dec. 21, 1995, now abandoned, which is a Continuation of Ser. No. 08/436,495, filed May 8, 1995, now abandoned, which is a Continuation of Ser. No. 07/924,506, filed Aug. 4, 1992, now abandoned, which is a Continuation-In-Part of Ser. No. 07/717,337, filed on Jun. 18, 1991, now abandoned. The present application and all preceding patent applications relate to disclosure document Ser. No. 229,472 which has the same title and inventor as the present application and was filed Jun. 19, 1989 under the Disclosure Document Program.

FIELD OF THE INVENTION

This invention relates to imbedded test structures for integrated circuits, and in particular to structures for testing those devices known as Application Specific Integrated Circuits or ASICs.

BACKGROUND OF THE INVENTION

This invention addresses the problem of testing complex digital integrated circuits. Many families of integrated circuits fall into the category known as ASICs. The most prolific of these is known as Gate Arrays. Gate Arrays are usually prefabricated up to a certain stage (typically through all steps except metalization). The metal patterns are then configured according to the needs of the user's application. For these types of ASICs, it is necessary to test the circuit after the fabrication process is completed to insure the integrity of the circuit.

Today, virtually all such testing is done by applying a stream of test vectors to the integrated circuit device. A test vector is a pattern of signal values, some of which are applied to the integrated circuit device, and some of which represent an expected response from the integrated circuit device. The important point is that these vectors are applied to the periphery of the integrated circuit device, in a sequence which corresponds to a proper operational sequence of the integrated circuit device's internal circuitry. Most important is that this stream of vectors must be created and that the burden of this tedious task almost always falls on the user himself.

There have been many attempts to provide software which creates these vectors automatically. Unfortunately, none of these attempts have produced a solution which works for the majority of user applications. Automated solutions which functionally exercise a circuit work best when the user's application is implemented in regular, synchronous circuits. To further automate the testing of such synchronous designs, engineers have often added test circuitry to integrated circuits which is known as "scan test" circuitry, also known as "LSSD" and "boundary scan" circuitry. Examples of this type of test circuit are many, and include U.S. Pat. Nos. 4,488,259 to Mercy, 4,441,075 to McMahon, 4,780,874 to Lenoski, and 4,682,329 to Kluth, among others.

Scan test structures rely on stages of registers placed between blocks of combinatorial logic where extra circuitry has been added to allow the register contents to be shifted either in or out to allow the initialization or observation of logic states during testing. Unfortunately, a great many engineers don't design fully synchronous circuits where this type of structure can be used.

Attempts have also been made to add various forms of imbedded test circuitry aimed at testing integrated circuits regardless of what design style was employed by the designer. One of these is shown in U.S. Pat. No. 4,739,250 to Tanizawa where a gate array comprised of logic cells has a separate access circuit attached to an input of each logic cell, this access circuit being able to force a specific logic value at the output of the logic cell under control of row and column selection wires. This scheme can test every logic cell and connection, but only if they are of the simple NAND or NOR variety. It cannot arbitrarily apply any pattern to the inputs of all logic cells due to the limitation of the row and column addressing which controls the access circuits which, in turn, drive the test input of each logic cell. While it is possible to construct a gate array which uses simple NAND or NOR gates as the logic cell, a more complex logic cell is generally more effective when test circuitry is to be added on a per-cell basis.

Another test circuit which is intended for integrated circuits which may use either synchronous or non-synchronous designs is shown in U.S. Pat. No. 4,749,947 to Gheewala. This approach adds a row and column grid which connects to transistor pass-gates to selectively observe or drive a net in the user's circuit. This circuit is intended primarily to provide complete observability when used in conjunction with automatic test vector generation software. It has a limited ability to drive signals in the circuit, again due to limitations inherent in row and column addressing. As with the previous example, this test architecture cannot arbitrarily apply any pattern to the inputs of all logic cells.

Yet another example of prior art test circuits is U.S. Pat. No. 4,752,729 to Jackson. Although this circuit appears to be intended mostly for applying patterns useful for life-testing a device, its technique has some application in general circuit test. Here, interface circuits are inserted at various points within an integrated circuit. Each interface circuit controls the value of the logic signal which passes through the particular net under control of test signals which come from the exterior of the device and are connected in common to all interface circuits. Interface circuits can allow a signal simply to pass through or alternately to be forced to a logic "1" or "0" value. It is important to note that since all interface circuits follow the same test signals, it is impossible to use this scheme for applying any arbitrary pattern to any logic circuit within the integrated circuit.

Each of the imbedded test circuits in the last three examples has some ability to test an integrated circuit device regardless of whether the designer chose synchronous or asynchronous design techniques. However, non of these can fully control all the inputs of an internal circuit simultaneously and thus test that circuit by applying any arbitrary pattern to its inputs. It is this controllability that has been lacking and thus prevented an integrated circuit to be fully tested for all possible design implementations, using an imbedded test circuit.

SUMMARY OF THE INVENTION

The object of the present invention is to provide, in an integrated circuit device containing multiple logic cells, imbedded test circuitry which does not require a particular design technique on the part of the user, or a particular logic cell structure (in other words, the designer may use synchronous or asynchronous design techniques). This imbedded test circuitry can also verify the integrity of the entire device without any knowledge of the operation of the implemented circuit as a whole. To accomplish this, a new architecture is disclosed which provides the ability to arbitrarily force any combination of logic values to be simultaneously driven onto any combination of internal nets. This allows all of the connections to each logic cell, and the logic cell itself, to be verified by applying a set of arbitrary test patterns to all of the inputs of each logic cell individually.

To apply any arbitrary test pattern to the inputs of a logic cell, the present invention provides test storage elements which are distributed throughout the integrated circuit device and control test circuits which determine the logic state on selected logic cell outputs within the integrated circuit device. These test circuits which allow any logic value to be forced on a logic cell output are inserted into each logic cell just before the logic cell output. As the addition of these circuits in series with the logic cells adds some delay to any logic signal passing through a logic cell, it is a further object of this invention to combine the test storage elements and added test circuits so as to minimize any added delay or additional numbers of transistors due to the presence of the imbedded test circuitry.

DETAILED DESCRIPTION

Figure 1:
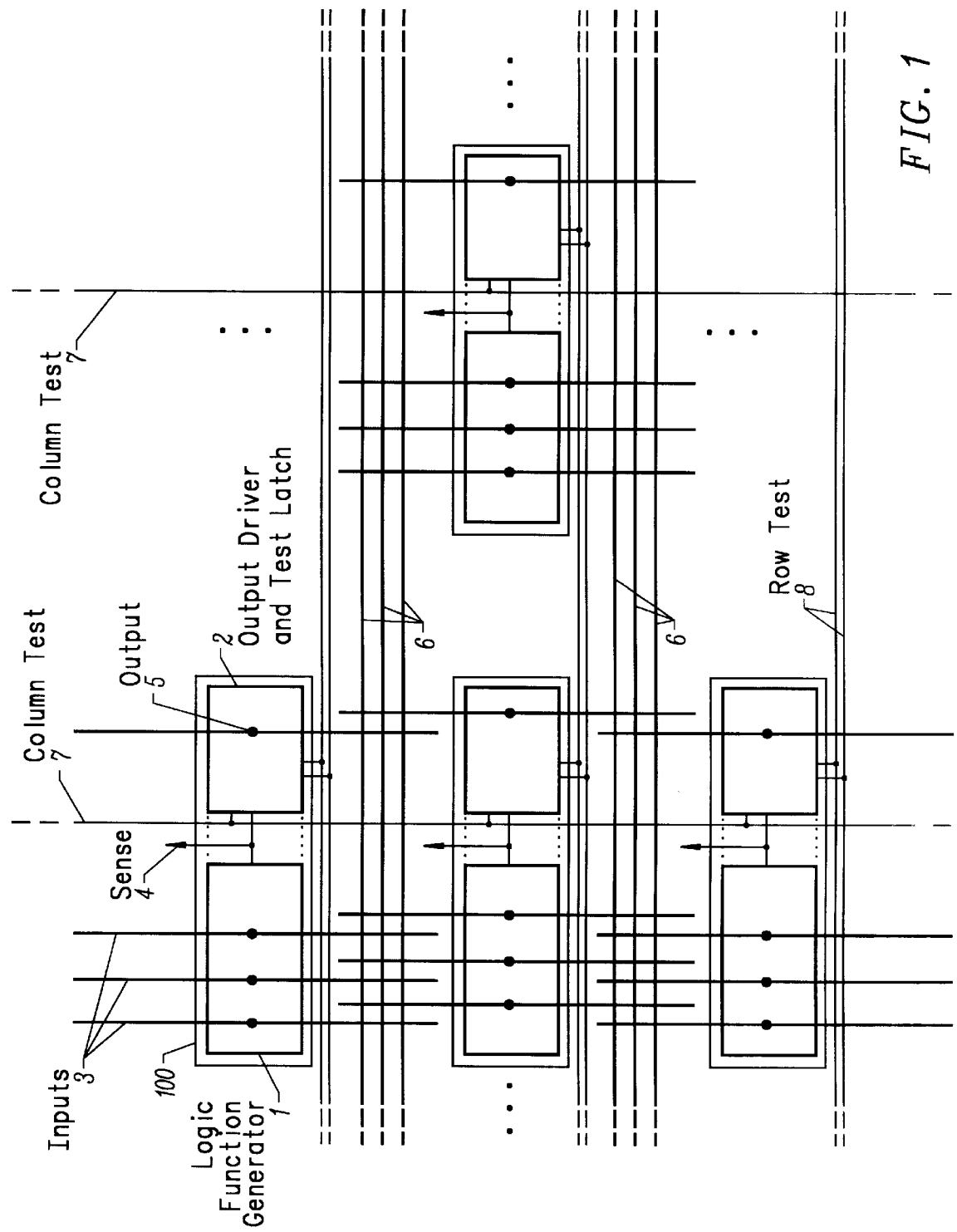
FIG. 1 shows a portion of the logic cell based array of an integrated circuit utilizing the present invention.

The present invention requires a logic cell based array approach as shown in FIG. 1. In accordance with the invention, each logic cell 100 is made up of two parts, the Logic Function Generator 1 and the Output Driver and Test Latch 2, which is inserted between the outputs of any driven circuitry (i.e., the logic function generator) and the logic cell output which would otherwise be connected to the logic function generator. There may be any number of inputs 3 to Logic Function Generator 1. The output of the Logic Function Generator 1 is connected to both the input of the Output Driver and Test Latch 2 and a sensing circuit (not shown). Many structures of sensing circuitry are known in the art and are therefore not mentioned here. The sensing circuit must be able to pass a logic value from the sense signal 4 to an external pin of the integrated circuit device. The output 5 of the Output Driver and Test Latch 2 may be connected to any number of inputs of other logic cells by way of routing tracks 6.

Output Driver and Test Latch 2 has a plurality of additional test inputs which are dedicated to the purpose of testing the drive. These test inputs include the Row Test bits 8 and the Column Test bits 7. These groups of test bits are driven along the rows and columns formed by the logic cells 100. Which group is chosen to drive the rows, and which the columns, is arbitrary. In the configuration shown, each Column Test bit 7 is applied to all the logic cells 100 in a column, and the Row Test bits 8 (each one common to all logic cells 100 in a row) are applied to the rows.

Figures 2, 2A:
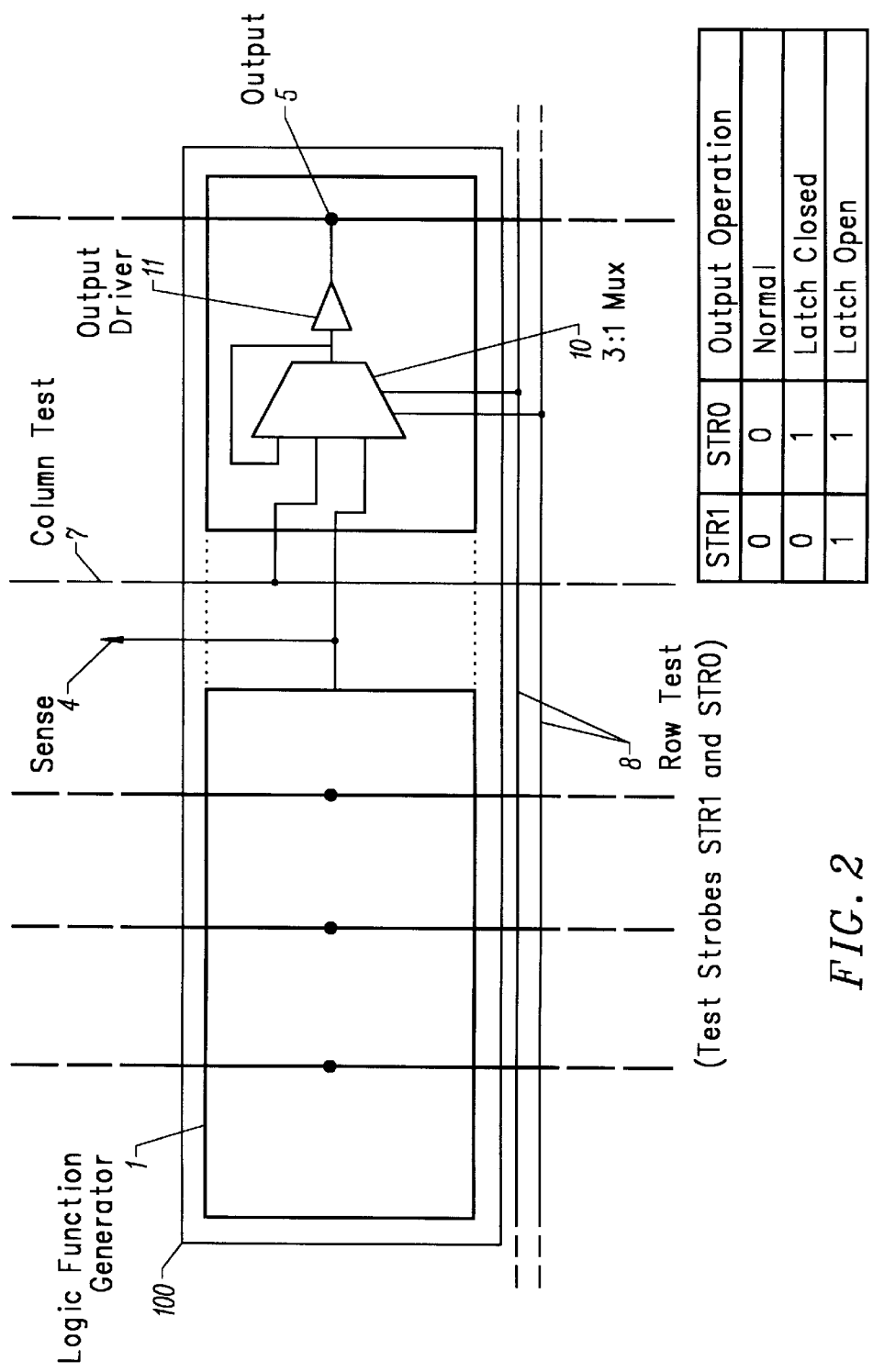
FIG. 2 shows an expanded view of one logic cell of the present invention showing the Logic Function Generator along with the Output Driver and Test Latch.
FIG. 2A shows how the value encoded in the Test Strobe bits of the circuit implementation of FIG. 2 affect the operation of that circuit.

As shown in FIG. 2A, in the example embodiment of FIG. 2 there are two Row Test bits 8, here named Test Strobes STR0 and STR1, which define three modes of operation: Normal, Latch Open (where a new test condition is entered by allowing a new Test Data value to be incorporated), and Latch Closed (where the test condition is frozen).

One embodiment for Output Driver and Test Latch 2 is shown in FIG. 2. Here, in FIG. 2, the test storage element is implemented with a latch made from a 3-to-1 Mux 10. This Test Latch then feeds the logic cell's Output Driver 11. It is important to note that, by combining in the same Mux 10, the test circuit which selects normal or test data as well as the Test Latch, fewer transistors will be necessary to implement the imbedded test function while any extra delay for logic signals passing through the Test Latch during normal operation is minimized.

Of course, other types of circuitry may be used for the test storage element which is here, in FIG. 2, implemented by a Test Latch. In addition to edge-triggered devices such as flip-flops, it is also acceptable to use dynamic storage elements where stored information may be lost after some time period has passed. Dynamic storage elements are acceptable when the number of nets which must be driven to test one particular logic cell is relatively small. Here, the test cycle time is relatively small compared with the retention time of the dynamic storage elements.

Figures 3, 3A:
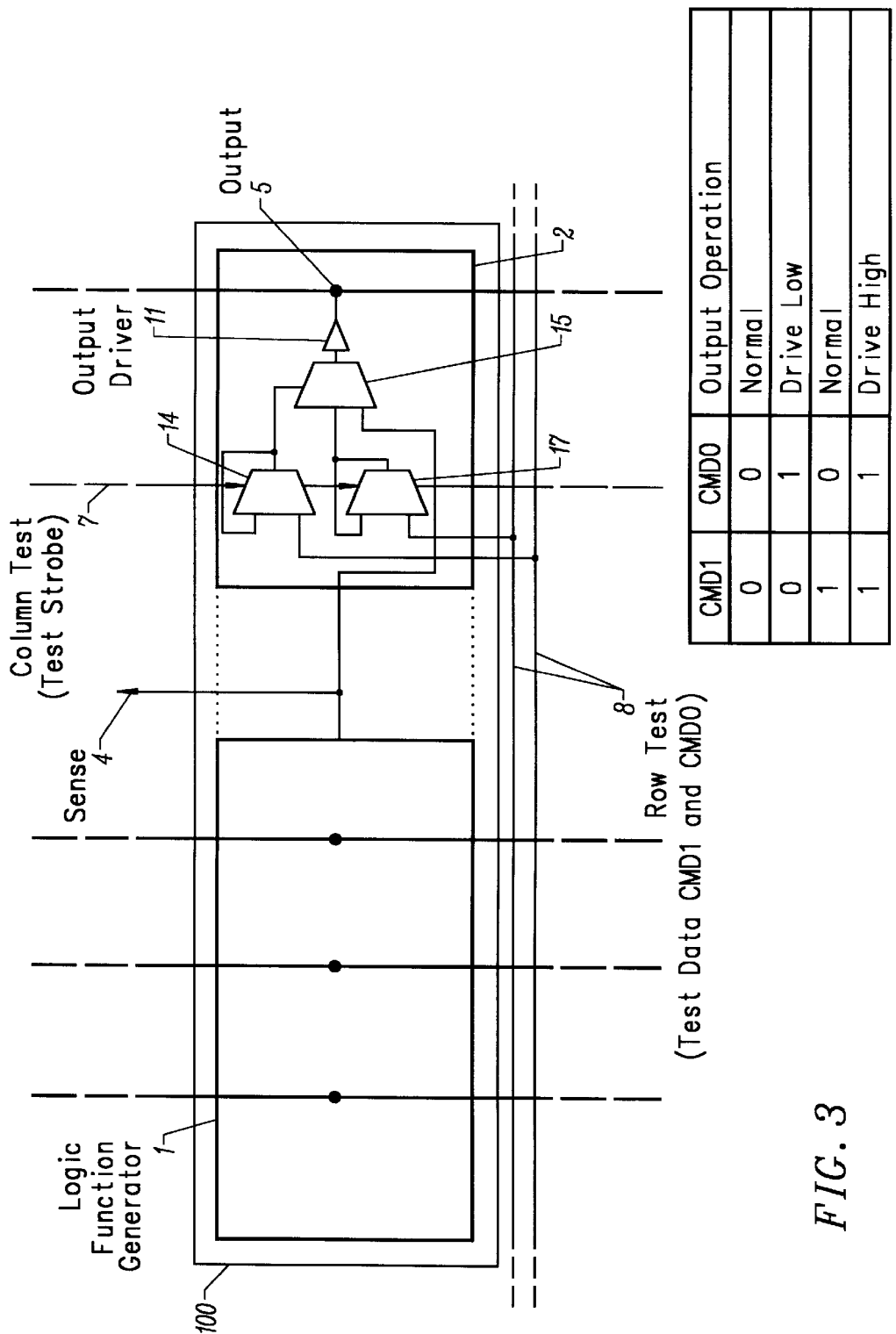
FIG. 3 shows an expanded view of an alternative embodiment of one logic cell having greater flexibility.
FIG. 3A shows how the value encoded in the Test Data bits of the circuit implementation of FIG. 3 affect the operation of that circuit.

One alternative embodiment is shown in FIG. 3. Here, a test command is applied to all of the logic cells 100 in a row via row Test bits 8 (here named Test Data bits CMD0 and CMD1 in FIG. 3A) and subsequently, Column Test 7, or Test Strobes, are applied to those logic cells 100 where it is desired that the test command take effect. This allows some logic cells in a row to be placed in a test condition (e.g., drive a high or low test value (see FIG. 3A)), while other logic cells in the same row are left in a normal condition where the output of Logic Function Generator 1 is passed to the Output Drive 11. To accomplish this, 2-to-1 Mux 14 store whether the logic cell 100 will be placed in a normal or test condition. The output of Mux 14 controls another Mux 15 which selects either the output of the Logic Function Generator 1 or the output of Mux 17, which stores a test value (a high or low value).

The embodiment shown in FIG. 3 provides a more flexible implementation than that of FIG. 2 in that a first logic cell can pass through the logic value generated by its Logic Function Generator to some driven logic cell. Meanwhile, other logic cells provide test values to control both the first logic cell and any driven logic cells. This logic value from the first logic cell can then be passed through to the output of the Logic Function Generator 1 of the driven logic cell where it is observed by a sensing circuit. In this way, the path from logic cell inputs 3 to the outputs 5 of Output Driver and Test Latch 2 can be tested. This is important since, during the testing of a single logic cell, the output logic value is available at the Sense signal 4 before it is applied to output selection Mux 15.

Even though imbedded test circuitry for a logic cell based array is not specifically shown with tri-state outputs circuits to implement the outputs of the Output Driver and Test Latch circuits, such a configuration is easily tested by the embodiment of FIG. 3, as a logic cell output which controls a particular tri-state output can also be forced to any desired logic value in the same manner. To verify that an output with tri-state capability of a logic cell under test has entered a high impedance condition, it is necessary to provide a pull-up resistor through which the output 5 of the Output Driver and Test Latch can connect to a known logic value so that the output 5 will be pulled to that known value when placed in a high impedance condition.

While particular embodiments of the present invention have been shown and described, it will be obvious to those skilled in the art that changes and modifications may be made without departing from this invention in its broader aspects and, therefore, the appended claims are to encompass within their scope all such changes and modification as fall within the true spirit and scope of this invention.

What is claimed is:

1. An integrated circuit, comprising:

a prefabricated array of logic cells, couplable to form an arbitrary circuit, wherein a plurality of logic cells in said array each includes a cell output;

and wherein each logic cell in said plurality of logic cells is capable, in its prefabricated state, of selectively producing, independent of said other logic cells and at said logic cell's respective cell output, a test value, which test value is independent of said arbitrary circuit, and a logic value, which logic value will be determined by said arbitrary circuit.

2. The integrated circuit of claim 1, wherein each of said logic cells further include a logic function generator, wherein, when said logic cells are coupled to form said arbitrary circuit, the logic function generator in some of said logic cells implements a synchronous function while the logic function generator in other of said logic cells implements an asynchronous function.

3. A method of forming an integrated circuit, comprising:

forming a prefabricated array of logic cells, couplable to form an arbitrary circuit, and prefabricated array independent of said arbitrary circuit, wherein each logic cell has a cell output, and wherein each logic cell is capable, in its prefabricated state, of selectively producing, independent of other logic cells in said prefabricated array and at said logic cell's respective cell output, a test value, which test value is independent of said arbitrary circuit, and a logic value, which logic value will be determined by said arbitrary circuit; and forming said arbitrary circuit specified by a user by coupling some of said logic cells in said array of logic cells to other logic cells in said array of logic cells.

\* \* \* \* \*